United States Patent [19]
Hegeler

[11] 3,983,497
[45] Sept. 28, 1976

[54] PHASE LOCKED LOOP

[75] Inventor: Wilhelm Hegeler, Hildesheim, Germany

[73] Assignee: Blaupunkt-Werke GmbH, Hildesheim, Germany

[22] Filed: Mar. 10, 1975

[21] Appl. No.: 557,040

[30] Foreign Application Priority Data
Mar. 21, 1974  Germany............................ 2413604

[52] U.S. Cl.............................. 328/155; 307/220 R; 307/233 A; 331/25
[51] Int. Cl.².......................................... H03B 3/04
[58] Field of Search ........ 328/155; 307/220, 233 A, 307/232; 331/25

[56] References Cited
UNITED STATES PATENTS

| | | | |
|---|---|---|---|
| 3,337,814 | 8/1967 | Brase et al. | 328/155 X |
| 3,354,403 | 11/1967 | Thomas | 331/25 X |
| 3,611,175 | 10/1971 | Buelke | 331/25 X |
| 3,714,589 | 1/1973 | Lewis | 328/155 |
| 3,781,695 | 12/1973 | Jackson | 328/155 |
| 3,805,192 | 4/1974 | Ocnaschek et al. | 331/25 X |
| 3,849,736 | 11/1974 | Enerson | 331/25 X |

*Primary Examiner*—John S. Heyman
*Attorney, Agent, or Firm*—Flynn & Frishauf

[57] ABSTRACT

A signal frequency, controlled by the output of a phase comparator, is obtained from a constant or reference signal frequency source by means of a frequency divider, the division ratio of which is voltage-controlled and variable, the control signal being obtained from the output of the phase comparator, in digital, or analog form. When in analog form, a monostable multivibrator is interposed so that a voltage-controlled divider having a division ratio of an average, predetermined factor can be used. The signal, the frequency of which is to be identified, is applied as one input to the phase comparator for comparison with the output signal from the frequency divider, the comparison providing the aforementioned division control signal.

4 Claims, 2 Drawing Figures

ANALOG CONTROL

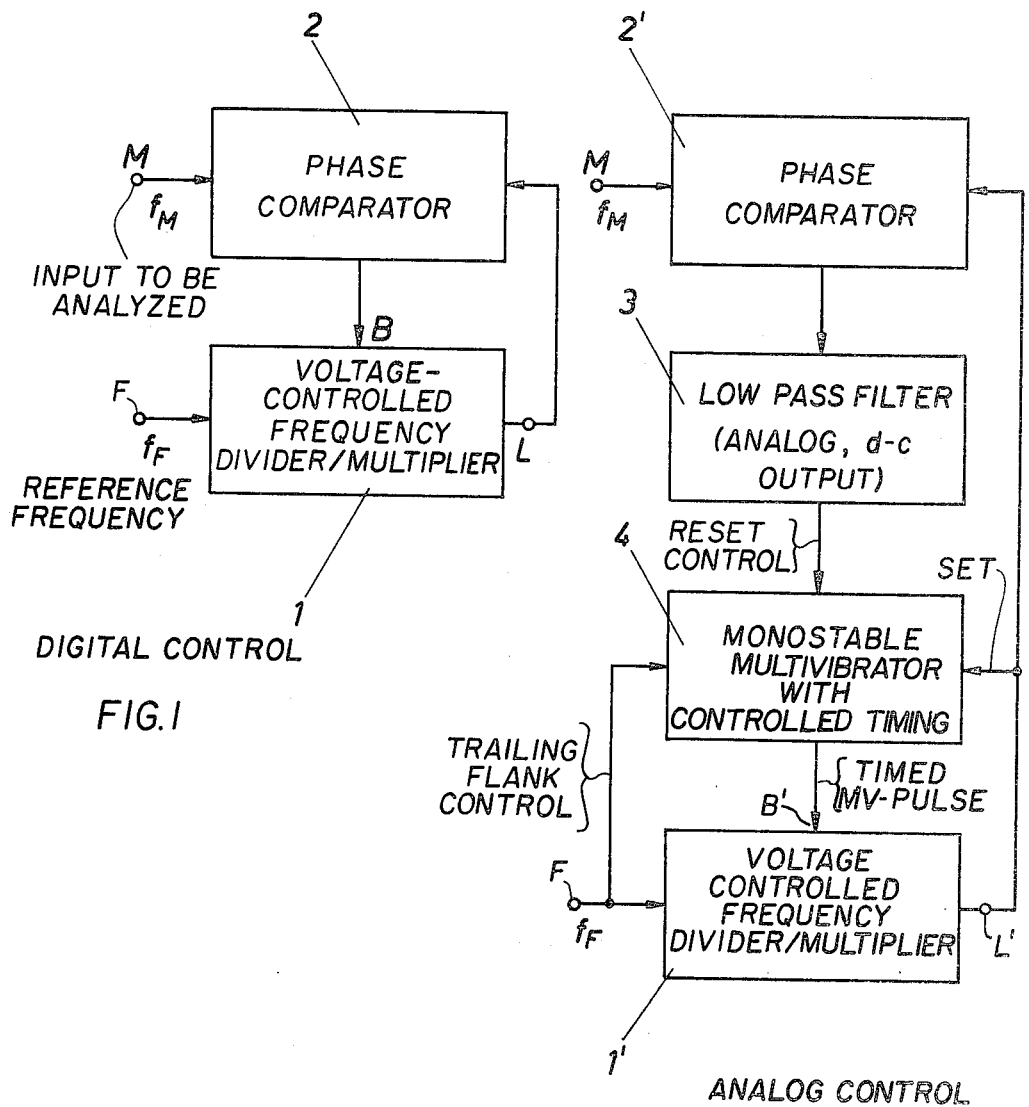

PHASE LOCKED LOOP

The present invention relates to a phase locked loop (hereinafter: PLL), which includes a phase comparator, to one input of which an input signal is applied which may include a frequency which is to be recognized. The PLL of the present invention is particularly useful in recognizing a specific frequency which occurs within a signal which includes a mixture of various frequencies.

The PLL system has previously been proposed to recognize a certain frequency within a mixture, or group of frequencies. In such systems, the frequency as well as the phasing of a controllable oscillator are brought in a stable, predetermined and defined relationship with respect to the frequency or the phasing, respectively, of an input signal. If the oscillator frequency follows the input frequency, the condition is customarily referred to as "synchronized," that is, the circuit is "locked in."

The evaluation of frequencies in PLL systems is not based on evaluating the duration of the individual periods of oscillations; rather, the fundamental wave component is evaluated, so that noise or stray peaks will not cause errors, or erroneous outputs.

PLL methods and systems have the disadvantage that a controller is required to control the oscillator — typically a voltage controlled oscillator — to the desired signal frequency. If various frequencies are to be identified, separate controllers are required to control the voltage controlled oscillator, one for each signal frequency. Furthermore, changes and drift in the base, or free-running frequency of the oscillator due to variations in temperature and voltages are practically unavoidable.

It is an object of the present invention to develop a new phase locked loop in which the disadvantages of the prior art are avoided.

SUBJECT MATTER OF THE PRESENT INVENTION

Briefly, a signal frequency, controlled by the output signal of a phase comparator, is obtained from a constant signal frequency source by means of a frequency divider, the division ratio of which is voltage controlled and variable.

The phase locked loop according to the present invention not only avoids the disadvantages of known PLL methods and systems, but additionally has the advantage that it can be easily programmed and results in rapid signal recognition.

The PLL, advantageously, permits the identification of frequencies in a frequency spectrum in two different ways: In one way, a digital signal is utilized to control the division ratios of a frequency divider; and in the other, an analog signal can be obtained to control the division ratios of the frequency divider.

The present invention can be used in the recognition of very low frequencies, in the order of from 20 Hz, for example. One application for such a PLL system is in recognition of identification frequencies used in traffic information systems described in the inventor's co-pending application Ser. No. 551,689 filed Feb. 21, 1975, now U.S. Pat. No. 3,949,401, assigned to the assignee of the present application.

The invention will be described by way of example with reference to the accompanying drawings, wherein:

FIG. 1 is a schematic block diagram of a phase locked loop (PLL) in which the control signals are of digital form; and FIG. 2 is a schematic block diagram of a PLL in which the control signals are of analog form.

The present invention will be described in connection with the recognition of specific signals arising in a frequency spectrum, in which the signals are obtained by frequency division from a higher-frequency signal, and will be described with reference to the automobile radio information system referred to in the above-identified co-pending application, now U.S. Pat. No. 3,949,401, although, of course, the principle of the present invention is not limited thereto.

A frequency spectrum, including the frequency $f_M$ to be identified, and for example having frequency ranges of between 20 to 150 Hz, is applied to terminal M of a phase comparator 2 which, for example, may simply be a coincidence element, such as an exclusive Or gate. A reference signal of frequency $f_F$ is applied to terminal F of a voltage controlled frequency divider, or multiplier 1. The output from the frequency controlled divider/multiplier 1 is available at terminal L, and is a signal of frequency $f_L$. This output frequency $f_L$ is applied as a second comparison input to phase comparator 2.

The constant signal or reference frequency $f_F$ applied to the input of the frequency divider 1 is divided by a suitable factor $a$, to obtain the comparison input frequency $f_L$ applied to the phase comparator 2. The term "division" or "multiplication" can be used interchangeably, since "division" can be thought of as multiplication with the reciprocal value. As an illustration, if element 1 is a frequency multiplier, then a multiplication factor of $a = 1/10$ may be assumed. In this case, the frequency divider is so programmed that it divides the reference frequency $f_F$ over a period of time by 10. The input B applied to the divider 1 is a digital signal. When the digital signal is 0, the division may, for example be by 9; when the digital signal is 1, the division will be by 11. Thus, on a time average, and if the terminal B switches back and forth uniformly — with with respect to time — between 0 and 1, the average division will be by about 10. Of course, a different division ratio may be selected, for example division by 8, and by 12 (depending on the binary value of the signal at terminal B), so that the average division ratio will again be the value $a = 10$.

When the PLL is locked, the binary signals 0 and 1 will appear with equal repetition rate at the input B of frequency divider 1, so that the latter will, on the average, divide by 10. When the frequency divider 1 does not, however, receive the binary information 0 and 1 with equal distribution (with respect to time), division will no longer occur with the average factor $a = 10$. Nevertheless, it will rapidly track to locked condition with the average division ratio of $a = 10$, as will be shown.

The factor a may be suitably selected. If the frequency F is, for example, a control frequency as used in the autoradio traffic information system, referred to in the aboveidentified U.S. Pat. No. 3,949,401, frequency $f_F$ may be a pilot frequency of, for example, 57 kHz, and the frequency $f_M$ may be any one regional recognition frequency, such as a frequency of 23.75 Hz. For this use, frequency divider 1 would be so constructed that it will divide — averaged over a predetermined time period — by 200, and by 12. The 200-factor may be invariant, but the average division ratio of 12 is controlled by the input terminal B, to vary between division by 11, or by 13, in dependence on the digital value of the signal at terminal B. Other division ratios may be selected, for example division by 10 and 14 which, time averaged, will again provide division by 12. Division of the signal of 57 kHz ($f_F$) by the factor $a = 12$ (on the time average) may be carried out first, and a subsequent fixed divider can then be used to frequency divide by 200.

Frequency divider 1 will, therefore, operate between upper and lower limit frequencies $f_1$ and $f_2$. In the first example selected ($a = 10$), the upper and lower frequencies will be obtained by division by 9, and 11 (or, for example, 8, and 12), respectively; in the example selected for autoradio traffic information, the upper and lower limit frequencies are defined as $$f_1 = \frac{57000}{11.200} \text{ Hz; lower frequency } f_2 = \frac{57000}{13.200} \text{ Hz.}$$

Operation — Definitions:

$f_M$ is frequency at input M of phase comparator 2;

$f_L$ is frequency at output L of frequency divider/multiplier 1, and comparison input frequency to phase comparator 2;

$f_1$, $f_2$ are limit frequencies at output L of frequency divider/multiplier 1, as determined by the instantaneous division ratios of the frequency divider, and defined by relationship (1);

$\phi$: phase difference of two similar flanks (leading, or trailing) of the signals at terminals M and L, respectively, using as a reference period the lower frequency in the range of $|\phi|$ to $\pi - |\phi|$;

$a$ : average division/multiplication ratio of divider/multiplier 1.

When the two frequencies applied to terminals M and L of phase comparator 2 are approximately equal, then a signal with double frequency and a pulse duty factor in accordance with relationship (2) will develop at the control input B. This pulse duty ratio, or duty factor results in a frequency at output L determined by relationship (3). The term "duty cycle" or "duty ratio" means the ON-OFF ratio of the binary signal, or the ratio of 0 and 1-signals at terminal B.

The phase difference $\phi$ varies by the angle $2\pi$ during one period of the beat frequency. A good approximation is determined by relationship (4). Solving the differential equation (4), one obtains relationship (5). If the conditions pertain that $f_1$ and $f_2$ are located on either side of $f_M$, mathematically: $f_1 \geq f_M \geq f_2$, then the value of $\phi$, for long periods of time $t$, will converge to the limit value given in relationship (6), since the exponential term of the solution to the differential equation [relationship 5)] will converge to 0. If, now, the limit frequencies $f_1$ and $f_2$ are so set that the frequency to be selected, or to be identified out of the frequency spectrum, namely the frequency $f_M$ is the arithmetic mean between the limit frequencies, then a phase difference of $\phi = \pi/2$ will result for the phase difference $\phi$. The arithmetic mean is mathematically given by relationship (7).

Occuring of convergence under the condition of equation (1) will be demonstrated by considering two cases.

If the initial phase $\phi$ is in the range $0 \leq \phi \leq \pi$, then because of $\phi = |\phi|$ the value of $\phi$ for long periods of time $t$, will converge to the limit value given in relationship (6), since the exponential term of the solution to the differential equation given in relationship (5) will converge to 0.

If the initial phase $\phi$ is in the range $-\pi < \phi < 0$, then because of $\phi = -|\phi|$ the exponential term in relationship (5) will increase till the phase $\phi$ will have met the range $0 \leq \phi \leq \pi$ and then because of $\phi = |\phi|$ the exponential term will converge to 0.

If the frequency $f_M$ is beyond the range formed by the limit frequencies $f_1$ and $f_2$, then the value of the exponential term will not converge to 0 and because of relationship (1) $f_M$ can not be equal to $f_L$: $f_M \neq f_L$. Under these conditions the PLL cannot lock in.

The phase $\phi$ passes in accordance with the parts of the exponential functions relationships.

If $\phi = |\phi|$, the constant term of equation (5), which is given by relationship (6) is beyond the range 0 to $\pi$, therefore convergence cannot occur and the phase $\phi$ changes to the range $-\pi$ to 0, in other words $\phi = -|\phi|$.

If $\phi = -|\phi|$, the constant term of equation (5) which is given by the negative value of relationship (6), is beyond the range $-\pi$ to 0, therefore convergence cannot occur, and the phase $\phi$ changes to the range 0 to $\pi$.

As a result of this periodic process the PLL cannot lock in.

In summary, the PLL circuit can only lock in when the exponential term in the differential equation of relationship (5) converges towards 0 for large time periods $t$. This is only the case when the condition of $f_1 \geq f_M \geq f_2$, that is, of relationships (1), obtains.

If the frequencies $f_M$ and $f_L$ are not in the same order of magnitude, then the duty cycle, or ON-OFF ratio at the control input B — averaged over a period of the frequency $f_L$ — will be approximately 1 : 1. The frequency $f_L$ will then be the average of the limit frequencies, mathematically $f_L = (f_1+f_2)/2$. Under these conditions, the PLL cannot lock in.

Information can be derived from the circuit, when locked in, as known. Thus, the circuit will provide an indication whether lock-in occurs or not, which information is avilable in binary (0 and 1-signals) form.

Referring now to FIG. 2, which indicates control of the PLL by analog signal: The input signal $f_M$ and the output signal from a voltage controlled frequency divider 1', similar to frequency divider 1 (FIG. 1) are applied to respective inputs of a phase comparator 2', similar to phase comparator 2. The output signal from phase comparator 2' is applied to a low-pass filter 3, the output from which provides a d-c voltage, in the form of an analog signal, having a value which is a function of the phase difference between the input signals of the phase comparator 2.

The value of the d-c signal determines the pulse duration of a monostable multivibrator MMV 4. The MMV 4 is set by a signal from the output of the voltage controlled frequency divider 1', so that the pulse frequency is equal to the frequency at the output L' from divider 1'. Counting is blocked during the duration of the output pulse from the MMV 4, so that the output frequency depends not only on the input frequency, but additionally on the signal from MMV 4.

Although not strictly necessary, a connection is made from the input F to the MMV 4 to define the exact instant of time of occurrence of the trailing flank of the MMV 4, that is, to determine the exact instant of time of the reset of MMV 4. As a result, the output of the low-pass filter 3 controls the number of the $f_F$ periods, the sum of which forms the pulse duration. This is an advantage in that the pulse duration or, rather, the integral with respect to time is an exact value for the number of the clock pulses which were suppressed in the voltage controlled frequency divider 1. By feedback of this information to the d-c voltage input of the MMV 4, a number of clock impulses which is not a whole number can be exactly suppressed, when extended over a time interval.

The setting of the control signal applied to terminal F, that is, its frequency is an indication of the signal applied to terminal M, so that, when the PLL is locked in, information regarding the signal $f_M$ can be determined from the known signal $f_F$. If the signal $f_F$ is a known signal, and a plurality of signals $f_M$ are applied to terminal M, locked-in condition, or non-locked-in condition of the PLL can likewise be determined and a binary output obtained, for example, from a second phase comparator. Since the PLL requires the limit signals $f_1$ and $f_2$ to be in the order of magnitude of the signal frequency $f_M$, so that the exponential term of relationship (5) goes to zero and so that the phase difference will be about $\pi/2$ [see also relationship (6)], locked-in condition of the PLL at predetermined division ratios $a$ will be indicative of the presence of the signal $f_M$ to be identified out of the spectrum of signals applied to terminal M. Thus, a binary 0-1 output is again available from the PLL, indicative of presence of the looked-for frequency $f_M$ within the signal of the frequency spectrum applied to terminal M. The frequency division ratio $a$ of the divider can be determined by suitable voltage control thereof, so that the frequency $f_M$ to be identified within the spectrum of frequencies applied to terminal M can be selected.

The control of the division ratio of the frequency divider/multiplier 1 is preferably by voltage control, although other control parameters may be used.

The control voltages applied to the frequency divider/multiplier may vary within small limits to set a small range between the frequency $f_1$ and $f_2$, as derived from the phase comparator 2. Additional, larger control voltages may be superimposed to effect different division ratios, for example to recognize different frequencies applied to terminal M, differing substantially from each other and substantially beyond the range of the limit frequencies between $f_1, f_2$ used for recognition of the specific frequency.

TABLE OF RELATIONSHIPS:

$$f_1 \geq f_L \geq f_2 \quad (1)$$

$$|\phi| \text{ to } \pi - |\phi| \quad (2)$$

$$f_L = \frac{|\phi|}{\pi} f_1 + \frac{\pi - |\phi|}{\pi} f_2 \quad (3)$$

$$d\phi/dt = 2\pi (f_M - f_L) = 2\pi (f_M - f_2) - 2(f_1 - f_2)|\phi| \quad (4)$$

$$\phi = \frac{\phi}{|\phi|} \pi \frac{f_M - f_2}{f_1 - f_2} - \left( \frac{\phi}{|\phi|} \pi \frac{f_M - f_2}{f_1 - f_2} - \phi_0 \right)$$

$$\cdot \exp - \left[ \frac{\phi}{|\phi|} 2 (f_1 - f_2) t \right] \text{ with } \phi_0 = \phi (t = o). \quad (5)$$

$$\pi \frac{f_M - f_2}{f_1 - f_2} \quad (6)$$

$$f_M = \frac{f_1 + f_2}{2} \quad (7)$$

I claim:

1. A phase locked loop comprising
a phase comparator (2) having a signal input (M) to which an input signal ($f_M$) is applied and a comparison input (L) to which a comparison signal ($f_L$) developed within the phase locked loop is applied, and a comparison output having a comparison output signal appear thereon which is representative of the relative phase position of the signals applied to said inputs (M, L);
and a controllable frequency divider/multiplier (1) having a control input (B) to control the division/multiplication ratio ($a$) thereof in accordance with the comparison output signals applied to said control input (B);
a fixed reference frequency ($f_F$) being applied to said divider/multiplier (1), the divider/multiplier providing an output frequency ($f_L$), said output frequency ($f_L$) forming said comparison signal being applied to the phase comparator (2), said output frequency ($f_L$) being representative of the reference frequency divided by the division/multiplication ratio ($a$) of the frequency divider/multiplier;
the output signal of said phase comparator (2) being connected to, and controlling the control input (B) of said frequency divider/multiplier (1) to control the division/multiplication ratio ($a$) thereof.

2. Phase locked loop according to claim 1, wherein the frequency divider/multiplier (1) is voltage controllable.

3. Phase locked loop according to claim 1, wherein the comparison output signal from the phase comparator is in form of a digital signal, said digital signal controlling the division/multiplication ratio ($a$) of the frequency divider/multiplier (1).

4. Phase locked loop according to claim 1, wherein the comparison output signal from the phase comparator (2') is in form of an analog signal of varying voltage; and a monostable multivibrator (4) is provided, controlled by said analog output signal from the phase comparator (2'), the output of the monostable multivibrator controlling the division/multiplication ratio ($a$) of the frequency divider/multiplier (1').

* * * * *